(12) United States Patent
Hatanaka et al.

(10) Patent No.: US 7,739,906 B2
(45) Date of Patent: Jun. 22, 2010

(54) SENSOR MODULE, WHEEL WITH SENSOR AND TIRE/WHEEL ASSEMBLY

(75) Inventors: Hidefumi Hatanaka, Kagoshima (JP); Kaoru Matsuo, Kogoshima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 12/392,896

(22) Filed: Feb. 25, 2009

(65) Prior Publication Data

US 2009/0211352 A1 Aug. 27, 2009

(30) Foreign Application Priority Data

Feb. 26, 2008 (JP) .............................. 2008-043879

(51) Int. Cl.
*E01C 23/00* (2006.01)
(52) U.S. Cl. ....................................................... 73/146
(58) Field of Classification Search .................. 73/146, 73/148, 204.22, 204.23, 204.26
See application file for complete search history.

(56) References Cited

U.S. PATENT DOCUMENTS

| | | | | |
|---|---|---|---|---|
| 6,698,272 | B1 * | 3/2004 | Almirante | 73/12.01 |
| 7,373,817 | B2 * | 5/2008 | Burdi et al. | 73/290 R |
| 7,607,355 | B2 * | 10/2009 | Shirasaka et al. | 73/754 |

FOREIGN PATENT DOCUMENTS

WO 2005-019790 3/2005

* cited by examiner

*Primary Examiner*—Jewel Thompson
(74) *Attorney, Agent, or Firm*—Stephen C. Beuerle; Pattric J. Rawlins; Procopio, Cory, Hargreaves & Savitch LLP

(57) ABSTRACT

A sensor module includes a substrate having a cavity in a surface thereof; a first sensor inside the cavity; a second sensor inside the cavity; and a lid body sealing the cavity and including an internal surface. The second sensor includes a first electrode located on an internal surface of the lid body and a second electrode located in the cavity.

20 Claims, 19 Drawing Sheets

SENSOR MODULE, WHEEL WITH SENSOR AND TIRE/WHEEL ASSEMBLY

CROSS-REFERENCE TO RELATED APPLICATION

The present application claims priority under 35 U.S.C. §119 to Japanese Patent Application No. 2008-043879, filed, Feb. 26, 2008, entitled "SENSOR MODULE, WHEEL WITH SENSOR AND TIRE/WHEEL ASSEMBLY," the entirety of which is incorporated herein by reference.

BACKGROUND OF THE INVENTION

1. Field of the Invention

The present invention relates to a sensor module in which a plurality of sensors are integrated, a wheel with a sensor and a tire/wheel assembly.

2. Description of the Related Art

In general, in order to simultaneously measure a plurality of physical quantities of a physical object, sensors corresponding to kinds of the physical quantities to be measured are necessary.

For example, there is a sensor device in which an acceleration sensor and a pressure sensor are arranged within one package. The acceleration sensor, the pressure sensor and an integrated circuit are arranged in parallel on one board surface of one large board.

In the case where it is necessary to attach a plurality of sensors to the physical object, if the number of the sensors is increased, the number of attaching positions is increased, and the mounting area of the sensors in the physical object is increased. As a result, not only the device structure becomes complicated, but also a characteristic of the physical object itself may be changed.

SUMMARY OF INVENTION

An aspect of the invention involves a sensor module including a substrate having a cavity in a surface thereof; a first sensor inside the cavity; a second sensor inside the cavity; and a lid body sealing the cavity and including an internal surface. The second sensor includes a first electrode located on an internal surface of the lid body and a second electrode located in the cavity.

DESCRIPTION OF PREFERRED EMBODIMENTS

Figure 1A:
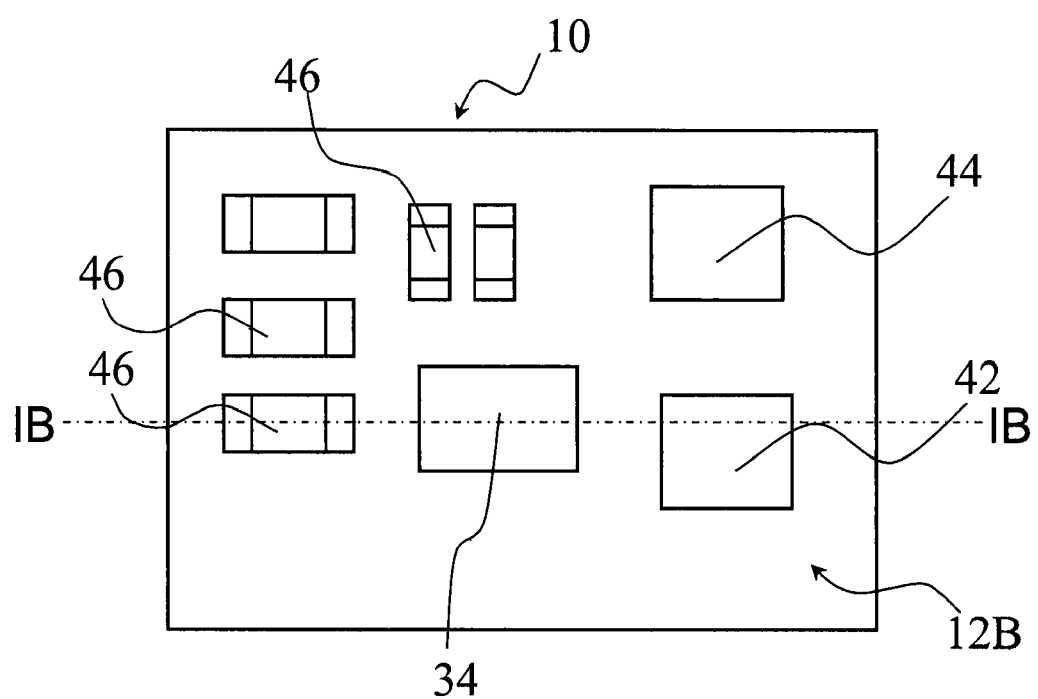
FIG. 1A is a schematic top plan view showing a sensor module in a state in which a sealing resin layer is removed.
Figure 1B:
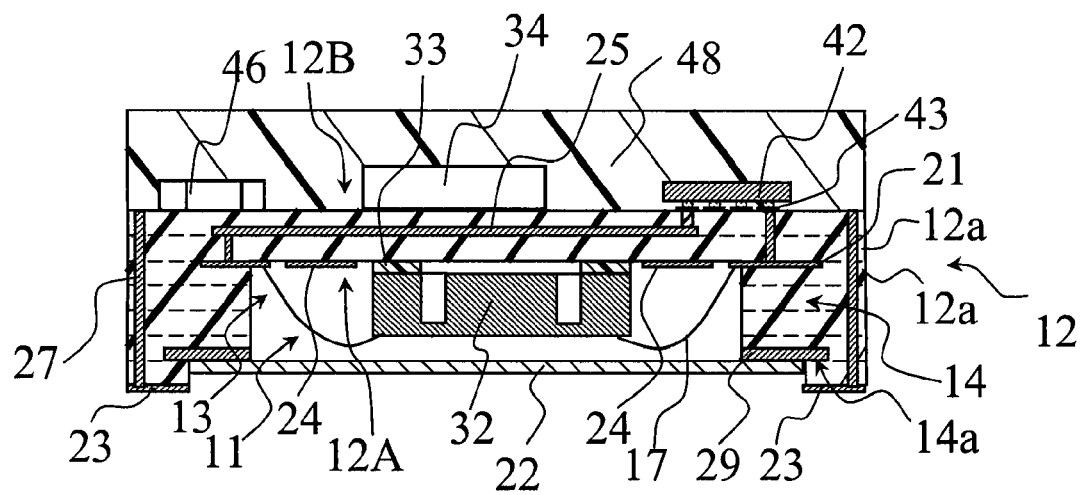
FIG. 1B is a schematic cross sectional view in a line IB-IB in FIG. 1A.
Figure 1C:
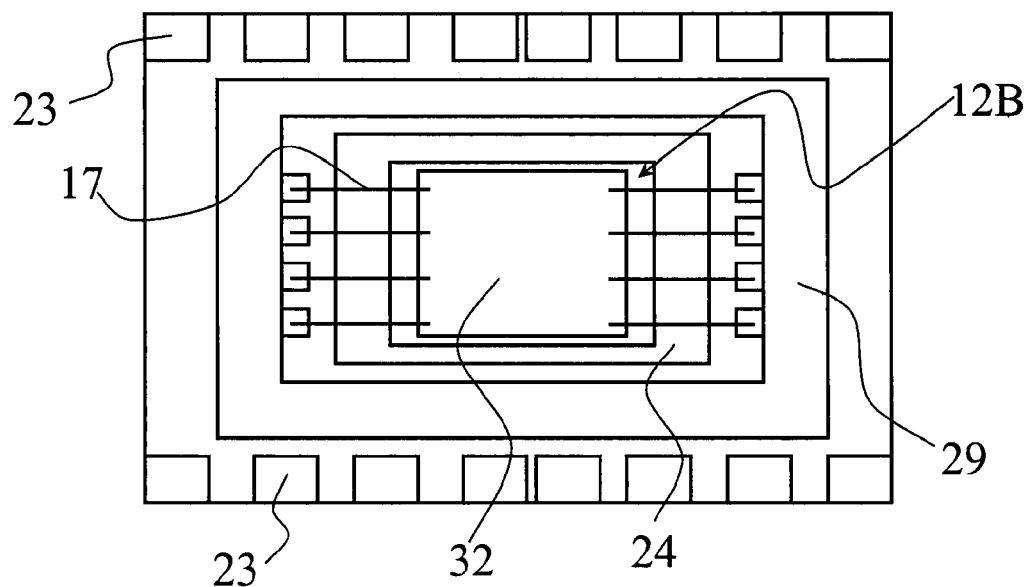
FIG. 1C is a schematic bottom plan view showing the sensor module according to one embodiment in a state in which a lid body is removed.

A description will be given in detail below of an embodiment with reference to the accompanying drawings. FIG. 1 is a view explaining a sensor module 10 in accordance with an embodiment. The sensor module in the present example is an example including an acceleration sensor corresponding to a first sensor, a pressure sensor corresponding to a second sensor, and a temperature sensor corresponding to a third sensor.

The sensor module 10 includes a base body 12, a lid body 22, an acceleration sensor 32, a pressure sensor 13, a temperature sensor element 34, an electronic circuit part, and a sealing resin layer 48.

The base body 12 has a frame portion 14 protruding from a mounting surface 12A on which the acceleration sensor 32 is mounted. The frame portion 14 is positioned in such a manner as to surround the acceleration sensor 32 of the mounting surface 12A. In other words, a sealing space is formed by being surrounded by the mounting surface 12A of the acceleration sensor 32 in the base body 12, an inner peripheral surface of the frame portion 14 protruding from the mounting surface 12A, and the lid body 22.

In this case, in the present example, the base body 12 is formed in such a manner that the frame portion 14 comes to a part of the base body 12, however, the structure is not limited to this. For example, the base body 12 may be formed by bonding a board constituted by a flat plate and the frame portion.

An external connecting terminal 23 is arranged in a protruding end surface of the frame portion 14. Further, there is a step portion provided 14a having a surface which is approximately in parallel to the mounting surface 12A of the frame portion 14. A lid body connecting electrode 29 is provided in the step portion 14a. A lid body 22, for example, made of a metal is fixed to the step portion 14a in a state in which a peripheral edge portion thereof is bonded, and the lid body 22 and the lid body connecting electrode 29 are electrically connected.

A cavity is structured such that the acceleration sensor 32 is accommodated in an inner portion of the cavity 11, and a fixed electrode 24 opposite of the lid body 22 is arranged in a surface of the mounting surface 12A in an inner portion of the cavity 11.

The lid body 22 is bonded to the step portion 14a provided in the inner side of the frame portion 14 mentioned below of the base body 12 so as to be fixed. The lid body 22 is bonded to the step portion 14a of the frame portion 14 by a seam welding or an adhesive agent, and closes (seals) the cavity 11 so as to form an accommodating space for the acceleration sensor 32. The lid body 22 is electrically connected to a lid body side electrode 29 provided in the step portion 14a. The fixed electrode 24 and the lid body side connecting electrode 29 are electrically connected to a circuit element 42.

The circuit element 42 normally monitors a value of an electric capacity in a gap between the fixed electrode 24 and the lid body side connecting electrode 29, and converts the value of the monitored electric capacity into a value of a pressure in an external portion of the cavity 11. The circuit element 42 outputs pressure value information to the external connecting terminal 23 via a hole conductor 27 and an internal wiring pattern 25.

The pressure sensor 13 includes the lid body 22, and the fixed electrode 24. The lid body 22 deforms in correspondence to a pressure difference between internal pressure of the cavity 11 and external pressure of the cavity 11. For example, if the pressure on an outer side of the cavity 11 becomes comparatively high, the lid body 22 is concaved toward an inner side of the cavity 11. On the other hand, if the pressure on an outer side of the cavity 11 becomes comparatively low, the lid body 22 is deformed in such a manner as to protrude toward the outer side of the cavity. An electrostatic capacity in the gap between the lid body 22 and the fixed electrode 24 fluctuates in correspondence to the deformation of the lid body 22, and the circuit element 42 determines a pressure value on the basis of the electrostatic capacity so as to output. In the sensor module 10, a diaphragm type pressure sensor 13 is constructed by the lid body 22 closing the cavity 11, and the fixed electrode 24 arranged within the cavity 11, as mentioned above.

The lid body 22 may be made of a metal with flexibility. For example, it is constituted by Ni—Fe alloy or Ni—Fe—Co alloy, and the thickness thereof is between 50 and 100 μm. The lid body 22 is not limited to the metal. The lid body 22 may have a conductivity, at least partly, and may be structured, for example, such that a plurality of insulating material layers, each of which is constituted by a metal layer, a ceramic and the like are laminated. A structure, a thickness and the like of the lid body 22 may be appropriately set in correspondence to a degree of a magnitude of the external pressure to be measured, a necessary measuring precision and the like, and the structure of the lid body 22 is not particularly limited.

Figure 2A:
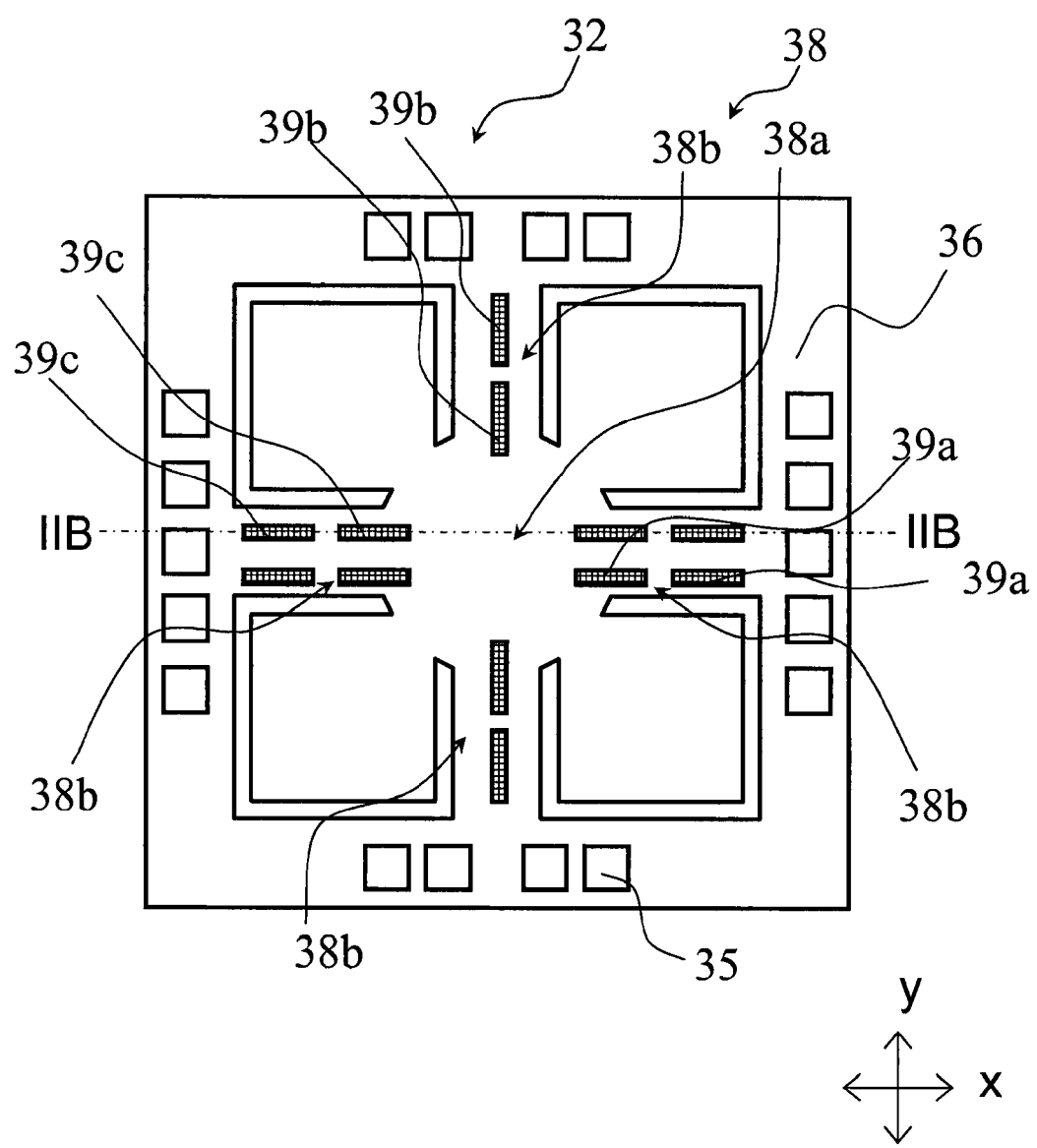
FIG. 2A is a schematic top plan view of an acceleration sensor according to one embodiment.
Figure 2B:
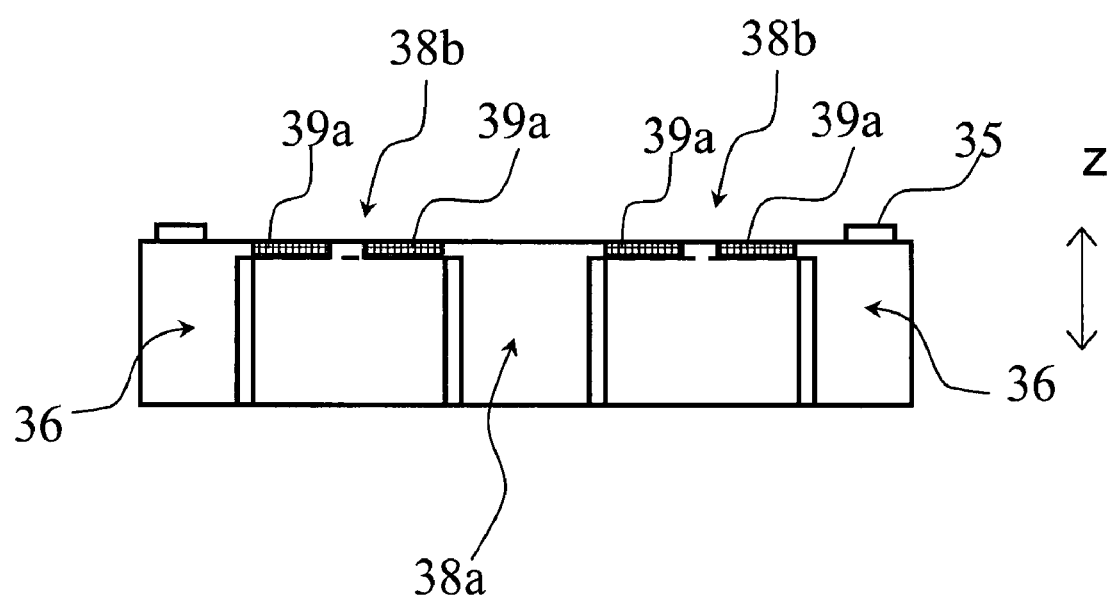
FIG. 2B is a schematic cross sectional view in a line IB-IB in FIG. 2A.

The acceleration sensor element 32 is constituted by a piezo resistance type acceleration sensor element, but is not limited to this. FIG. 2 is a view explaining the acceleration sensor 32. FIG. 2A is a schematic top plan view of an acceleration sensor according to one embodiment and FIG. 2B is a schematic cross sectional view in a line IIB-IIB in FIG. 2A. The acceleration sensor 32 is fixed to the mounting surface 12A of the base body 12 by an adhesive agent 33 such as an epoxy adhesive agent or the like. The acceleration sensor 32 is structured such that a movable body 38 corresponding to a movable portion is arranged in an internal region surrounded by a frame body 36. The frame body 36 corresponds to a fixed portion which is bonded to the mounting surface 12A of the base body 12 so as to be fixed. The movable body 38 is provided with a heavy bob portion 38a arranged in an internal region surrounded by the frame body 36, and a beam portion 38b extending to the heavy bob portion 38a from the lid body 22 side of the frame body 36 so as to support the heavy bob portion 38a. In the acceleration sensor 32, the distance between the heavy bob portion 38a and the mounting surface 12A is regulated by the thickness of the adhesive agent 33, and a gap between the heavy bob portion 38a and the mounting surface 12A is set, for example, to 10 μm.

A plurality of beam portions 38b are provided with resistance elements 39a, 39b and 39c which deform together with the deformation of the beam portions 38b, and are constituted by piezo resistor generating an electric signal in response to the deformation. In the beam portions 38b, there is the resistance element 39a for detecting an acceleration in an x-axis direction, the resistance element 39b for detecting an acceleration in a y-axis direction, and the resistance element 39c for detecting an acceleration in a z-axis direction, respectively. A surface of the frame body 36 is provided with an electrode pad 35 which is connected to each of the resistance elements 39a to 39c via a conductor pattern (not shown). The electrode pad 35 in the sensor module 10 is electrically connected to a connecting pad 21 close to the base body 12, via a conducting wire 17 formed by a wire bonding.

If the acceleration is generated in the acceleration sensor 32, the heavy bob portion 38a deforms on the basis of inertia, each of the beam portions 38b deforms in correspondence to a magnitude and a direction of the acceleration, and an electric signal is output from each of the resistance elements 39a to 39c in correspondence to the deformation. The electric signal output from each of the resistance elements 39a to 39c in correspondence to the deformation of each of the beam portions 38b is transmitted to the connecting pad 21 close to the base body 12 via the electrode pad 35. The connecting pad 21 connected to the electrode pad 35 is electrically connected to a circuit element 44, and the circuit element 44 normally monitors the electric signal corresponding to the deformation output from the piezo resistor 39. The circuit element 44 further converts the monitored electric information into the acceleration of the acceleration sensor 32, and outputs the converted acceleration information to the external connecting terminal 23 via the hole conductor 27 and the internal wiring pattern 25.

As mentioned above, the acceleration sensor 32 is a sensor measuring a different physical quantity from the diaphragm type pressure sensor 13 constructed by the lid body 22 and the fixed electrode 24. In the sensor module 10, it is possible to integrate the diaphragm type pressure sensor 13, and the acceleration sensor 32 measuring the different physical quantity from the diaphragm type pressure sensor 13 at a comparatively smaller mounting area, by arranging the acceleration sensor 32 in an inner side of the cavity 11.

Further, the sensor module 10 arranges a circuit element 42 for converting output information (information of the electrostatic capacity) from the diaphragm type pressure sensor 13 into a value of the pressure in the outer side of the cavity 11 on the board surface 12B in an opposite side to the base body 12. A circuit element 44 for converting output information (an electric signal corresponding to the deformation mentioned above) from the acceleration sensor 32 into the acceleration of the acceleration sensor 32 is also arranged on the board surface 12B. Accordingly, it is possible to make the mounting area of the sensor and the circuit in the sensor module comparatively smaller, for example, in comparison with the case that each of the circuit elements 42 and 44 is provided on the surface of the base body 12 in parallel to the diaphragm type pressure sensor 13 and the acceleration sensor 32. Further, various electronic parts constituted by a condenser 46 and the like are mounted on the board surface 12B of the base body 12, and the sensor module 10 is constructed further comparatively compact. In each of the modes and the embodiments described in the present specification, the circuit elements 42 and 44 are provided in each of them, however, these circuit elements are not necessarily provided. For example, the structure may be made such as to directly output the information of the electrostatic capacity, the electric signal corresponding to the deformation and the like from the external connecting terminal.

The base body 12 can employ a ceramic laminated circuit board. The ceramic material can employ an aluminum oxide quality sintered body, an aluminum nitride quality sintered body, a mullite quality sintered body, a silicon carbide quality sintered body, a silicon nitride quality sintered body, a glass-ceramic and the like, but is not limited to them.

A description will be given specifically of the case that it is constituted by the aluminum oxide quality sintered body. First of all, an appropriate organic binder, solvent, plasticizer, dispersant are added and mixed into a ceramic raw material powder such as an aluminum oxide, a silicon oxide, a magnesium oxide, a calcium oxide or the like, and they are formed as a sheet shape by using a sheet forming method such as a doctor blade method or the like. A conductor paste forming the connecting pad 21, the external connecting terminal 23, the internal wiring pattern 25 and the hole conductor 27 is printed or applied to the obtained ceramic green sheet. A laminated ceramic formed body is obtained by laminating and crimping the ceramic green sheets. The laminated ceramic formed body is sintered at the temperature of about 1600 degrees C.

The connecting pad 21, the external connecting terminal 23 and the internal wiring pattern 25 are constituted by a metal powder metallization of a tungsten, a molybdenum, a copper, a silver or the like, but not limited to them. For example, a conductor paste is obtained by adding and mixing an appropriate organic binder, solvent, plasticizer, dispersant or the like to the metal powder of the tungsten or the like. A protective layer may be formed on an exposed surface of the connecting pad 21, the external connecting terminal 23 and the internal wiring pattern 25. For example, in order to prevent the conductor surface from being oxidized and corroded and to improve a junction with a conductive jointing material such as a solder or the like, a nickel plating layer having a thickness between about 1 and 10 μm and a gold plating layer having a thickness between about 0.1 and 3 μm are sequentially attached.

In the sensor module 10, the lid body 22 is arranged in such a manner as to cover the side of the beam portion 38b of the acceleration sensor 32, and even in the case that a comparatively strong acceleration is generated in the z-axis direction, a displacement of the heavy bob portion 38a is suppressed to a range of the gap between the acceleration sensor 32 and the lid body 22.

The acceleration sensor 32 shown in FIG. 2 can be manufactured by processing a so-called SOI wafer structured, for example, such that the silicon layer is laminated via an oxide film by utilizing a semiconductor micro-fabrication technique (a so-called micro machining technique).

In the acceleration sensor 32 corresponding to a micro structure, an element characteristic, for example, a temperature characteristic or the like is different one by one per each of the elements, due to a difference of a working precision of the heavy bob portion 38a or the beam portion 38b at the time of manufacturing (in other words, a difference of dimensional precision of the heavy bob portion 38a or the beam portion 38b). Further, an output value from the acceleration sensor 32 in the sensor module 10 is different, for example, in accordance with mounting state (for example, an inclination in an installed state) of the acceleration sensor 32 to the base body 12. In the sensor module 10, a memory portion (not shown), for example, ROM or the like is provided in the circuit element 44, and specific temperature characteristic compensation data of the acceleration sensor 32, specific inclination compensation data of the sensor module 10 and the like are stored in the memory portion. The circuit element 44 receives an electric signal in correspondence to the deformation output from the piezo resistor 39 of the acceleration sensor 32, applies a necessary compensating process to the received electric signal by using the temperature characteristic compensation data, the inclination compensation data and the like stored in the memory portion, and outputs suitable acceleration data in correspondence to each of the sensor modules.

Figure 3:
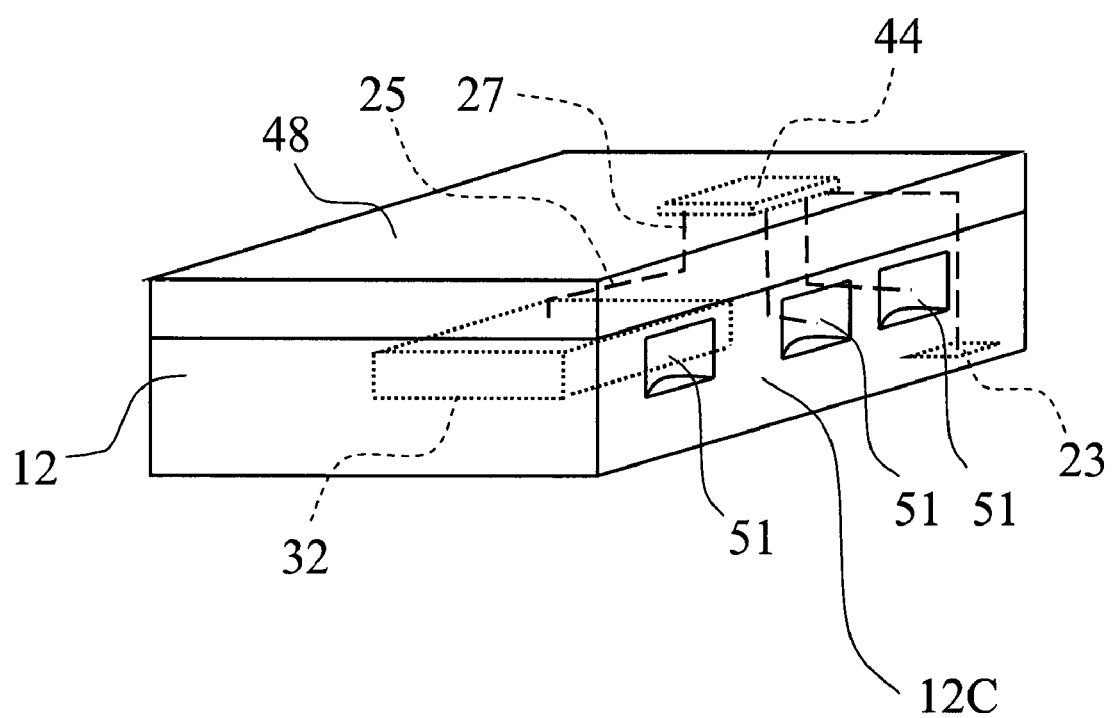
FIG. 3 is a schematic perspective view of the sensor module according to one embodiment shown in FIG. 1.

The compensation data may be generated, for example, by individually carrying out a test on the sensor modules one by one, and the generated compensation data may be input from the compensation data input pad provided in the sensor module 10. As shown in FIG. 3, a compensation data input pad 51 is provided in a side surface 12C of the base body 12. The compensation data input pad 51 is connected to the circuit element 44 via the hole conductor 27 and the internal wiring pattern 25 (only a part thereof is shown in FIG. 3). For example, a leading end of a pin-shaped external terminal (not shown) is brought into contact with the compensation data input pad 51, and the compensation data output from the external terminal is input to the memory portion of the circuit element 44 via the hole conductor 27 and the internal wiring pattern 25. In the sensor module 10 in accordance with the present embodiment, a concave portion having a predetermined curvature in its surface is formed in the side surface 12C of the base body 12, and the compensation data input pad 51 is formed in a surface of the concave portion. Accordingly, it is possible to comparatively improve a working property at the time of bringing the leading end of the external terminal into contact with the compensation data input pad 51 and a contact state between the leading end of the external terminal and the compensation data input pad, and it is possible to reduce generation of a problem such as an input error of the compensation data or the like, and the manufacturing cost is made comparatively low. In this case, as mentioned above, the circuit element 44 is connected also to the external connecting terminal 23 via the hole conductor 27 and the internal wiring pattern 25. It is possible to repeatedly rewrite various compensation data stored in the memory portion of the circuit element 44 by inputting the correction data via the external terminal 23. For example, it is possible to obtain an output value with a comparatively high precision, in each of a plurality of mounting states, by rewriting the various compensation data stored in the memory portion, in correspondence to each of the states in which the sensor module 10 is mounted to an external mounting physical object (mounting board 62 mentioned below and the like).

The condenser 46 or the like is a known electronic part constructing a predetermined circuit in cooperation with the circuit elements 42 and 44. In the sensor module 10, the various electronic parts constituted by the condensers 46 and the like are mounted to the board surface 12B of the base body 12, and the sensor module 10 is constructed comparatively compactly.

The electronic circuit part is arranged in the board surface 12B of the base body 12. The electronic circuit part includes the third sensor 34, the circuit elements 42 and 44, and/or the condenser 46. For example, the circuit elements 42 and 44 are connected to the electrode pad 43 connected to the hole conductor 27 and the internal wiring pattern 25, in accordance with a flip chip mounting. In this case, the circuit elements 42 and 44 may be installed onto the board surface 12B of the base body 12 by an adhesive agent or the like, and may be electrically connected to the electrode pad 43 or the like provided in the board surface 12B by a conducting wire formed by a wire bonding or the like.

The external connecting terminal 23 is provided in the protruding end surface of the protruding portion 14. The external connecting terminal 23 is electrically connected to the circuit elements 42 and 44 and the like via the hole conductor 27 or the internal wiring pattern 25, and the electrode pad 43 of the board surface 12B or the wiring pattern (not shown). The signals are output from each of the circuit elements 42 and 44 via the external connecting terminal 23. It is possible to input a predetermined control signal, compensation data mentioned below and the like to each of the circuit elements 42 and 44 via the external terminal 23.

The fixed electrode 24 and the lid body side connecting electrode 29 are electrically connected to the circuit element 42 via the hole conductor 27 and the internal wiring pattern 25. In this case, in each of the accompanying drawings of the present specification, the connecting pad 21, the internal wiring pattern 25 and the hole conductor 27 are only partly shown. In each of the embodiments of the sensor module in accordance with the present invention, each of the portions constructing the sensor module 10 is electrically connected as described in the present specification. The layouts and the shapes of the connecting pad, the internal wiring pattern, the via hole conductor and the like in the base body are not particularly limited.

In the sensor module 10, the third sensor 34 is further arranged in the board surface 12B of the base body 12. The third sensor 34 is constituted, for example, by a temperature sensor. The third sensor 34 is fixed to the surface of the board surface 12B, for example, by an adhesive agent or the like. The temperature sensor 34 is electrically connected to the circuit element 44, and transmits measured current temperature information to the circuit element 44. The circuit element 44 receives the electric signal in correspondence to the deformation output from the piezo resistor 39 of the acceleration sensor 32, thereafter carries out a necessary compensating process with respect to the received electric signal on the basis of the current temperature information received from the temperature sensor 34, and the temperature characteristic compensation data stored in the memory portion, and outputs suitable acceleration data in correspondence to the current temperature. In the present embodiment, the temperature sensor is structured by arranging the temperature sensor element corresponding to the independent member from the circuit elements 42 and 44 in the board surface 12B, however, it may be structured, for example, by integrally providing the temperature sensor element in the circuit element 42 or the circuit element 44.

The base body 12 is a region which directly comes into contact with the external mounting physical object (for example, the mounting board 62 mentioned below or the like) and has a comparatively great temperature change caused by a heat inflow from the external portion and a heat outflow to the external portion. In the sensor module 10, since the acceleration sensor 32 and the third sensor 34 are respectively mounted to the opposite mounting surface 12A and board surface 12B in the base body 12, the temperature profiles of the acceleration sensor 32 and the third sensor 34 come comparatively close to each other. In other words, the current temperature measured by the third sensor 34 coincides with the current temperature of the acceleration sensor 32 at a comparatively high precision. Accordingly, if the electric signal from the acceleration sensor is temperature compensated on the basis of the current temperature measured by the third sensor 34, in the circuit element 44, it is possible to comparatively accurately compensate the temperature on the basis of the actual temperature state of the first sensor. The temperature profile comparatively well coincides with the acceleration sensor 32 in the same manner with regard to the circuit element 42 and the circuit element 44. Even in the case that the temperature sensor portion is provided integrally with the circuit element 42 and the circuit element 44, it is possible to obtain an output value having a comparatively high precision in accordance with the temperature compensation.

The electric circuit parts arranged in the board surface 12B in the opposite side of the base body 12 and constituted by the third sensor 34, the circuit elements 42 and 44, the condenser 46 and the like are coated by the sealing resin layer 48, for example, made of the resin material. The sealing resin layer 48 is made, for example, of an epoxy resin or the like, and protects each of the parts arranged in the board surface 12B. The sealing resin layer 48 is formed by applying, for example, the epoxy resin in accordance with a well-known screen printing method in such a manner as to cover the top surfaces of the third sensor 34, the electronic circuit parts and the like, and thereafter curing, for example, on the basis of heating at 180 degrees C. for 60 minutes. Even in the case that the sensor module 10 is mounted within a high-temperature, high-humidity and high-impact environment, for example, the tire or the like, the sealing resin layer 48 protects each of the parts from the water, the humidity, the mechanical impact or the like, and reliability of the sensor module 10 is maintained comparatively high.

The sealing resin layer 48 keeps away from the acceleration sensor 32 after the lapse of the base body 12, and the acceleration sensor 32 is accommodated within the cavity 11. Accordingly, if an outgas is generated from the sealing resin layer 48, it is possible to suppress influence of the outgas on the acceleration sensor 32 and each of the circuit elements 42 and 44 to be comparatively low. Therefore, even if the sensor module 10 is arranged, for example, under a high-temperature, high-humidity and high-impact environment, the acceleration sensor 32 and the circuit elements 42 and 44 can go on working at a comparatively high reliability.

In the diaphragm type pressure sensor 13, in order to further increase the measuring precision of the pressure, that is, measuring precision of the electrostatic capacity, it is necessary to make the gap between the lid body 22 and the fixed electrode 24 small, or make the opposite area between the lid body 22 and the fixed electrode 24 large. In the sensor module 10 shown in FIG. 1, it is possible to make the opposite area between the lid body 22 and the fixed electrode 24 comparatively large by making the area of the mounting surface 12A in the cavity 11 comparatively large and making the magnitude of the acceleration sensor 32 comparatively small.

Figure 4:
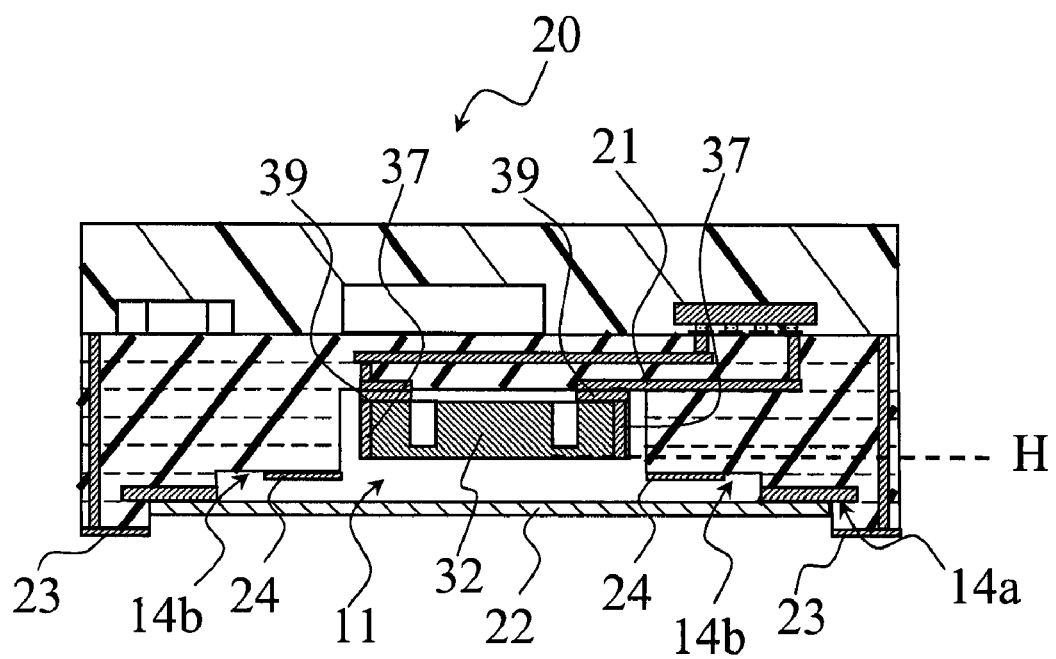
FIG. 4 is a schematic cross sectional view of the sensor module according to one embodiment.

A description will be given of a sensor module 20 in accordance with an embodiment using FIG. 4. Comparing with the embodiment in FIG. 1, the position of the fixed electrode is different in the present example.

In the inner portion of the cavity 11, a second step portion 14b protruding from the mounting surface 12A of the base body 12 is formed in such a manner as to surround the acceleration sensor 32. The step portion 14b is positioned at a gap between the step portion 14a to which the peripheral edge portion of the lid body 22 is bonded, and a height position H of the acceleration sensor 32 accommodated within the cavity 11. In the sensor module 20 in FIG. 4, a fixed electrode 24 is arranged in the second step portion 14b.

Since the position of the fixed electrode 24 is closer to the lid body 22 in comparison with the embodiment in FIG. 1, the electrostatic capacity between the lid body 22 and the fixed electrode 24 is larger. The position of the step portion 14b, that is the fixed electrode 24, may be set to a position closer to the mounting surface 12A than the height position H of the acceleration sensor 32. In this case, in order to increase sensitivity of the diaphragm type pressure sensor 13, it is preferable to set the acceleration sensor 32 as close to the lid body 22 as possible.

The acceleration sensor 32 is flip-chip mounted to the base body 12. In other words, the frame body 36 is provided with a via hole conductor 37, and the electrode pad 35 provided in the surface of the frame body 36 and the electrode pad 21 are electrically connected via the via hole conductor 37.

Figure 5:
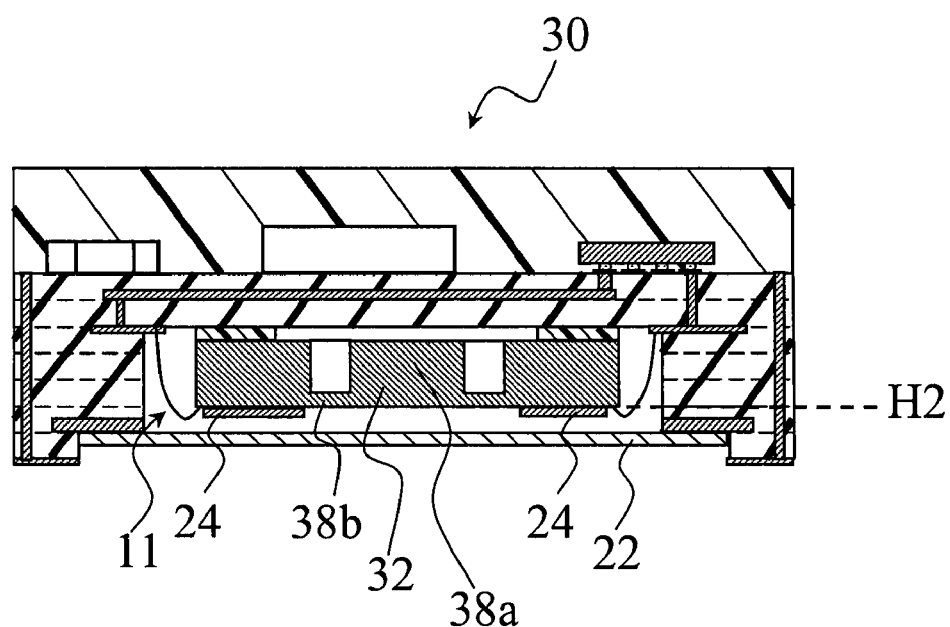
FIG. 5 is a schematic cross sectional view of the sensor module according to one embodiment.

A description will be given of an embodiment using FIG. 5. A fixed electrode is provided in the surface of the acceleration sensor 32 arranged within the cavity 11.

It is possible to make the electrostatic capacity between the fixed electrode 24 and the lid body 22 comparatively large, and it is possible to make the measuring precision of the pressure comparatively high, by providing the fixed electrode 24 in the surface of the acceleration sensor 32.

The side of the acceleration sensor 32 in which the beam portion 38b, the resistance elements 39a to 39c and the electrode pad 35 are provided, is opposite of the mounting surface 12A of the base body 12. The fixed electrode 24 is provided in an opposite side (a back side) to the side in which the resistance elements 39a to 39c and the electrode pad 35 are provided. The resistance element, the wiring pattern or the electrode pad is not arranged in the back side, and it is possible to arrange the fixed electrode 24 in a comparatively wide area.

Since the distance between the resistance element 39 and the electrode pad 21 of the base body 12 is comparatively short in the sensor module 40, it is possible to make an extra capacity component causing a noise generated in the process of transmission of the signal comparatively small, and it is possible to comparatively reduce the noise generated in the electric signal output from the resistance elements 39a to 39c of the acceleration sensor 32. Accordingly, it is possible to further increase the precision of the acceleration sensor.

Figure 6:
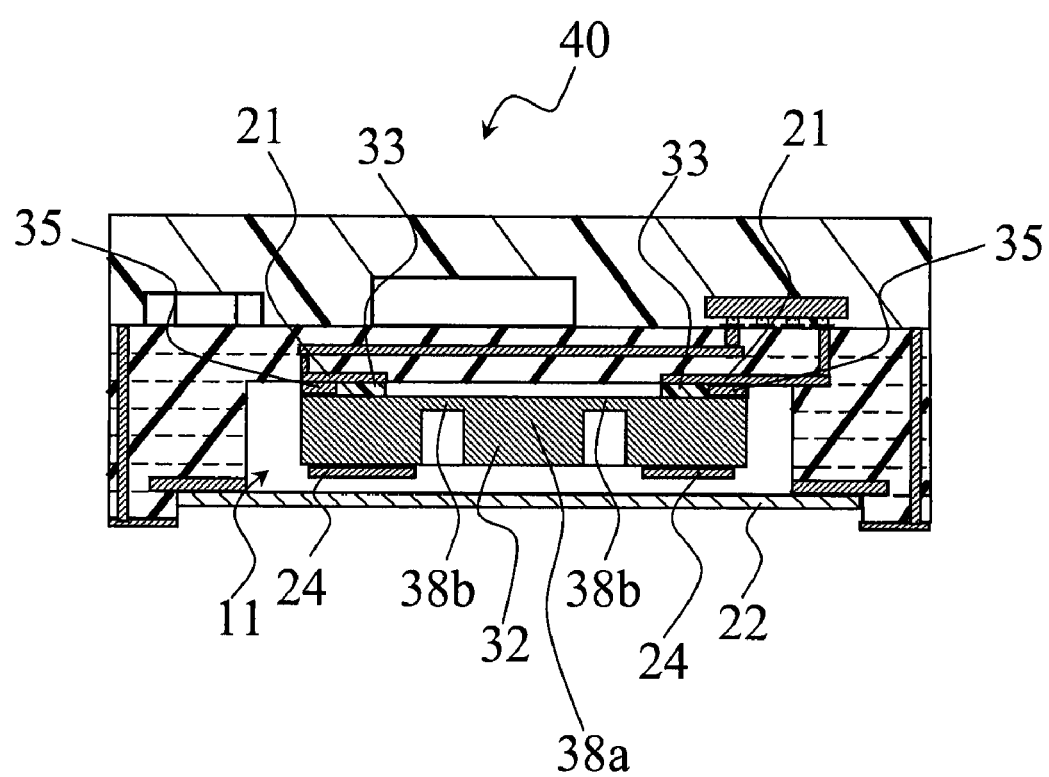
FIG. 6 is a schematic cross sectional view of the sensor module according to one embodiment.

Next, a description will be given of three modified examples of the embodiment mentioned above. Firstly, a description will be given of the modified example of the sensor module in FIG. 5 using FIG. 6. The acceleration sensor 32 is flip-chip mounted. Further, the acceleration sensor 32 is bonded to the mounting surface 12A of the base body 12 by using the adhesive agent 33. The acceleration sensor 32 is bonded to the base body 12 at a higher bonding strength.

Figure 7:
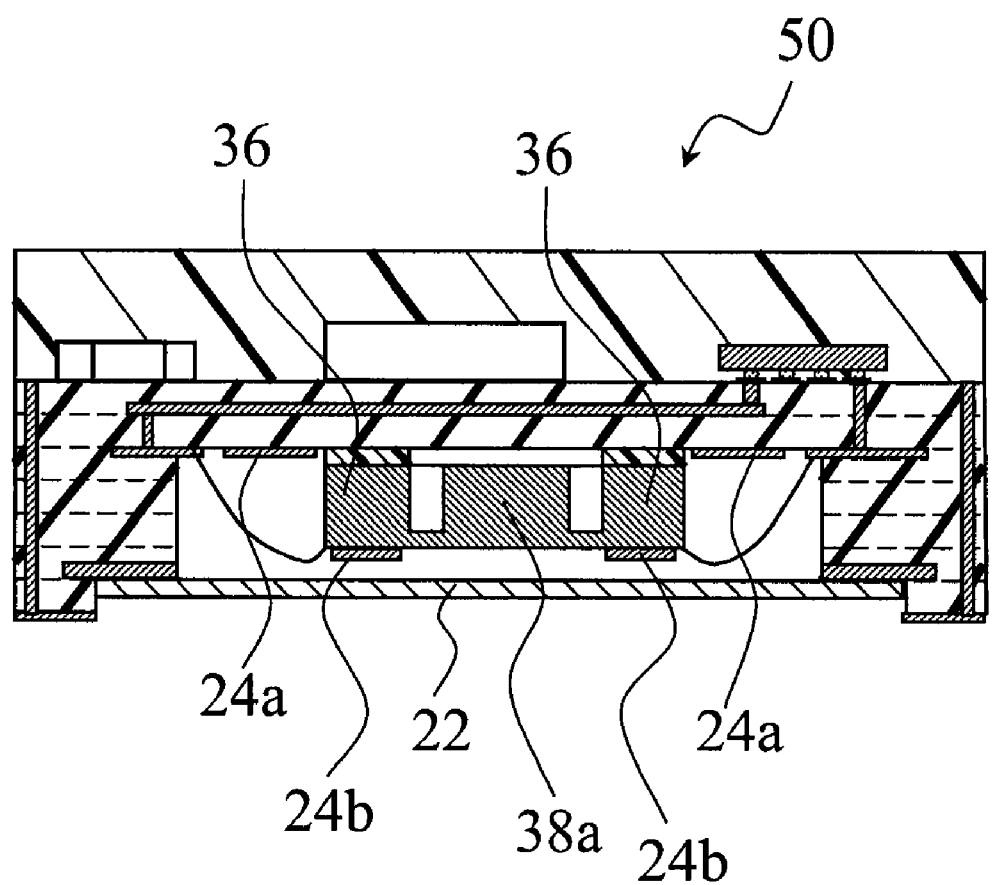
FIG. 7 is a schematic cross sectional view of the sensor module according to one embodiment.

Secondly, a description will be given of the modified example of the sensor module in FIG. 1 or 5 using FIG. 7. A first fixed electrode 24a is arranged in the mounting surface 12A corresponding to the surface of the base body 12, and a second fixed electrode 24b is arranged in the surface of the frame body 36 of the acceleration sensor 32. Accordingly, the electrostatic capacity of the diaphragm type pressure sensor 13 comes to a magnitude obtained by combining a first capacity portion constructed by the first fixed electrode 24a and the lid body 22, and a second capacity portion constructed by the second fixed electrode 24b and the lid body 22.

Figure 8:
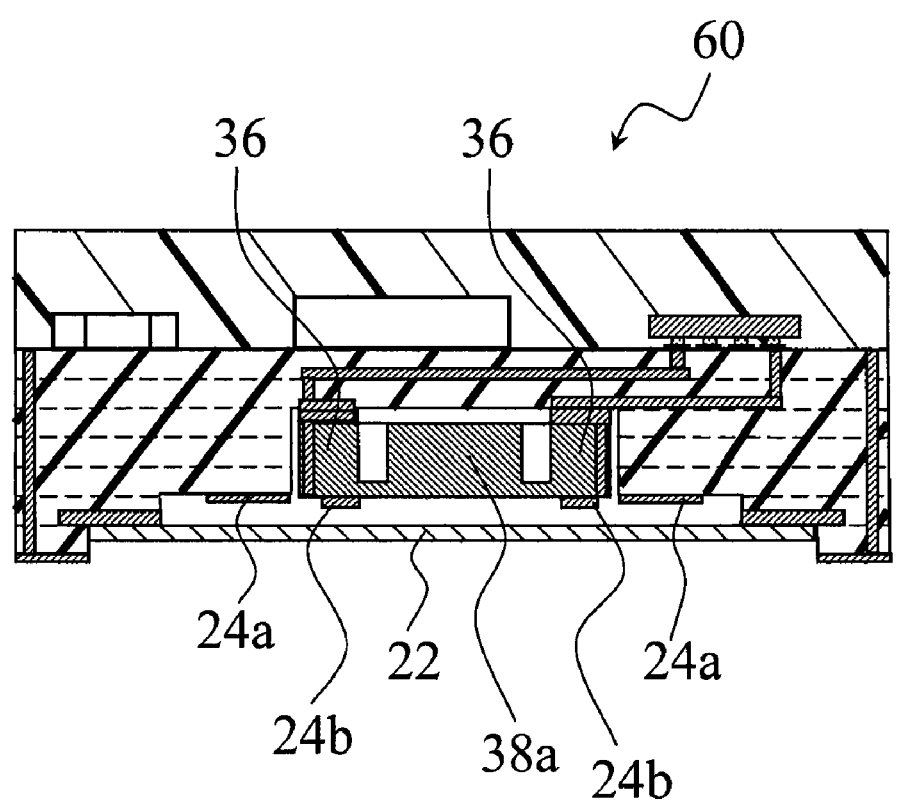
FIG. 8 is a schematic cross sectional view of the sensor module according to one embodiment.

Thirdly, a description will be given of the other modified example of the sensor module in FIG. 4 or 5 using FIG. 8. A second step portion 14b is formed in the inner portion of the cavity 11, in the same manner as the sensor module in FIG. 4. The first fixed electrode 24a is arranged in the second step portion 14b, and the second fixed electrode 24b is arranged in the surface of the frame body 36 of the acceleration sensor 32. The electrostatic capacity of the diaphragm type pressure sensor 13 comes to a magnitude obtained by combining the first capacity portion constructed by the first fixed electrode 24a and the lid body 22, and the second capacity portion constructed by the second fixed electrode 24b and the lid body 22.

Figure 9A:
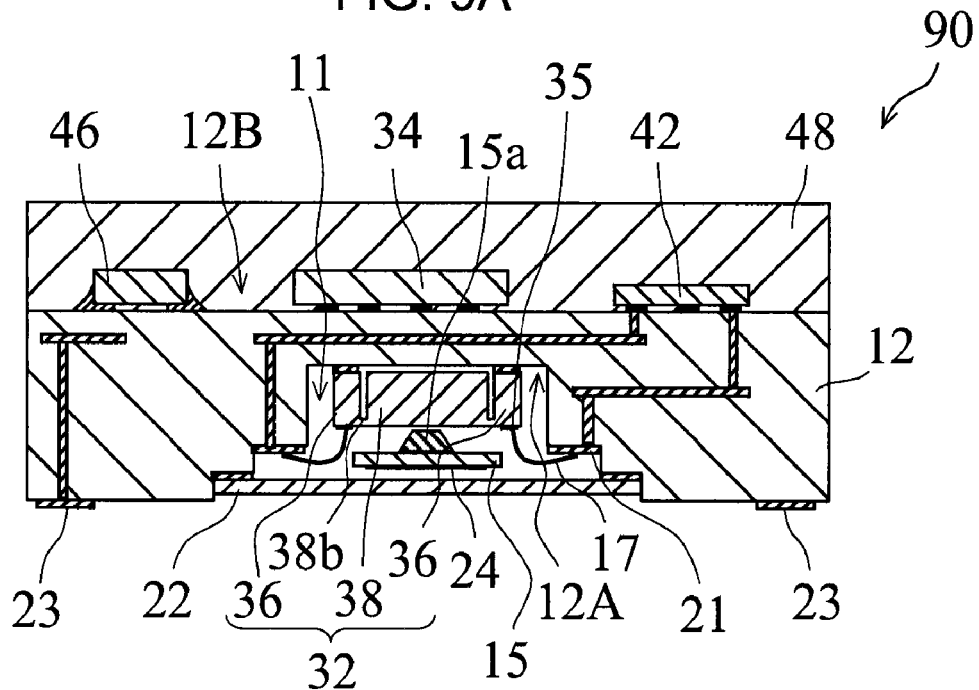
FIG. 9A is a schematic cross sectional view of the sensor module according to one embodiment.
Figure 9B:
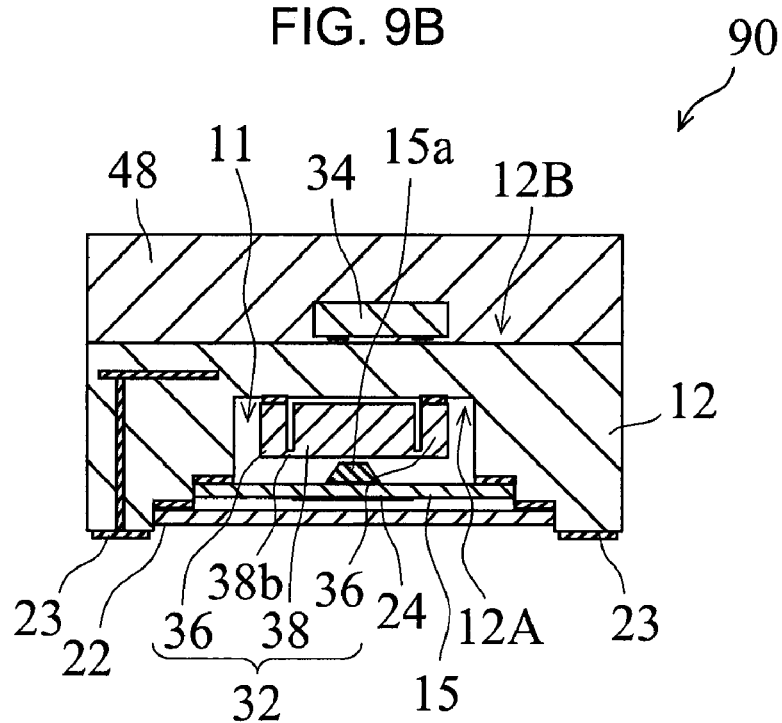
FIG. 9B is a schematic cross sectional view of the sensor module according to one embodiment.

A description will be given of an embodiment using FIG. 9. FIG. 9 includes FIG. 9A showing a cross section in a direction corresponding to the same direction as the direction IB-IB in FIG. 1, and FIG. 9B showing a cross section in an orthogonal direction to the direction IB-IB. A fixed member 15 is arranged between the lid body 22 and the acceleration sensor 32 in such a manner as to be in parallel to the lid body 22. The fixed electrode 24 is arranged in the surface of the lid body 22 in such a manner as to be opposite of a region 22a having a conductivity in the lid body 22. In accordance with the sensor module 90, it is possible to sufficiently secure the area for obtaining the electrostatic capacity of the diaphragm type pressure sensor 13 by the fixed electrode 24 formed in the fixed member 15 which is arranged independently from the acceleration sensor 32, and it is possible to keep the position of the fixed electrode 24 constant within the cavity 11.

In the sensor module 90, the fixed member 15 may be structured such that the ceramic material constructing the base body 12 is formed in a plate shape. The fixed electrode 24 in the sensor module 90 may be formed in the surface of the fixed member 15 in the same manner as the metal powder metallization formed in the inner portion and the surface of the base body 12.

Further, the acceleration sensor 32 has the fixed portion 36 fixed within the accommodating space and the movable portion 38 supported to the fixed portion 36 in the same manner as the sensor module 10 in FIG. 1, and the fixed member 15 is opposite of the movable portion 38 of the acceleration sensor 32 at a critical position in a movable range, in the sensor module 90. Specifically, a projection portion 15a is provided in the surface close to the acceleration sensor 32 of the fixed member 15, and a leading end portion of the projection portion 15a is arranged at a critical position in a deformable range of the beam portion 38b in the movable portion 38 of the acceleration sensor 32. In accordance with the sensor module 90, since the movable portion 38 does not deform over the limit of the movable range in the acceleration sensor 32, and the acceleration sensor 32 is hard to break, it is possible to reduce the generation of malfunctions.

Since the fixed electrode 24 is arranged in the side opposite of the lid body 22 in the fixed member 15, it is possible to make the distance between the lid body 22 and the fixed electrode 24 small, and it is possible to make the electrostatic capacity obtained as the diaphragm pressure sensor 13 large. Accordingly, it is possible to detect the pressure at a higher sensitivity.

Since the acceleration sensor 32 includes the fixed portion 36 fixed within the cavity 11 corresponding to the accommodating space and the movable portion 38 supported to the fixed portion 36 and having the sensor pattern in the lid body 22 side, the fixed member 15 is opposite of the movable portion 38 in the critical position of the movable range, and the fixed member 15 has the fixed electrode 24 as the region having a conductivity in the side opposite of the lid body 22 of the insulative base material, the piezo resistance type semiconductor element formed in the acceleration sensor 32 does not come into contact with the fixed electrode 24 even if the acceleration sensor 32 deforms and the movable body 38 comes into contact with the fixed member 15, and a short circuit of the electric signals between the sensor portions is hard to be generated. Accordingly, it is possible to obtain a sensor module 90 in which each of the physical quantities is stably detected.

As shown in FIG. 9B, since both ends of the fixed member 15 are fixed in such a manner as to stride over the opening portion of the cavity 11 in both sides of a position sandwiching the acceleration sensor 32, it is possible to obtain an unwasted structure in which the acceleration sensor 32, the fixed member 15 and the lid body 22 overlap within the small space. Accordingly, it is possible to obtain the sensor module 90 in which it is easy to achieve a downsizing.

As shown in FIG. 9A, since the acceleration sensor 32 has the electrode pad 35 in the outer side of the fixed member 15 in the opposite side of the lid body 22, and the electrode pad 35 is connected to the connecting pad 21 arranged in the outer side of the fixed member 15 around the acceleration sensor 32 with respect to the cavity 11 corresponding to the accommodating space via the conducting wire 17, the conducting wire 17 and the fixed member 15 do not overlap in the direction in which the acceleration sensor 32 and the lid body 22 oppose, in the case of using the conducting wire 17. Accordingly, it is possible to ideally shorten the distance between the acceleration sensor 32 and the lid body 22.

It is possible to employ the metal plate material in the same manner as the lid body 22 for the portion except the projection portion 15a, as the fixed member 15, and it is possible to utilize a whole of the fixed member 15 except the projection portion 15a as the fixed electrode 24.

A description will be given of a modified example of the sensor module in FIG. 9 using FIG. 10. In accordance with a sensor module 100, the fixed member 15 separates the accommodating space of the acceleration sensor 32 sealed by the lid body 22 into a first space 11a close to the acceleration sensor 32 and a second space 11b close to the lid body 22, and the spaces 11a and 11b are sealed.

The first space 11a may be filled by using an inert gas, for example, a helium, an argon or the like. Since a change such as an oxidization or a reduction is hard to generate in the acceleration sensor 32, the characteristic of the acceleration sensor 32 becomes hard to change. The first space 11a may be set to an approximately equal air pressure to an ambient pressure. The second space 11b may be set to a lower air pressure than the first space 11a. The sensitivity of the pressure measurement is increased by deforming the lid body 22 in correspondence to the change on the basis of the external pressure of the sensor module 100 and reducing the deformation of the fixed member 15 at a time when the lid body 22 deforms.

Since the influence of the external pressure on the first space 11a becomes small at a time when the external pressure of the sensor module 100 is changed, by enlarging the difference between the air pressure of the first space 11a and the air pressure of the second space 11b, it is possible to make the deformation of the fixed member 15 small regardless of the material of the fixed member 15. Accordingly, it is possible to more accurately measure the external pressure of the sensor module 100.

It is desirable to employ the fixed member 15 in which rigidity against the deformation is higher than the lid body 22 and, for example, in the case that the material of the fixed member 15 is the same as the material of the lid body 22, it is desirable to make the thickness of the fixed member 15 larger than the thickness of the lid body 22, for example, equal to or more than 1.5 times.

When the second space 11b is depressurized, a change of volume of the gas within the second space 11b generated by the change of the temperature becomes small, and a change of the air pressure within the second space 11b becomes small. Accordingly, it is possible to more accurately measure the external pressure of the sensor module 100.

In particular, in the case of setting the air pressure of the second space 11b to a degree of vacuum which is equal to or less than 104 Pa, the sensor module 100 can be utilized as an absolute pressure sensor.

Figure 10:
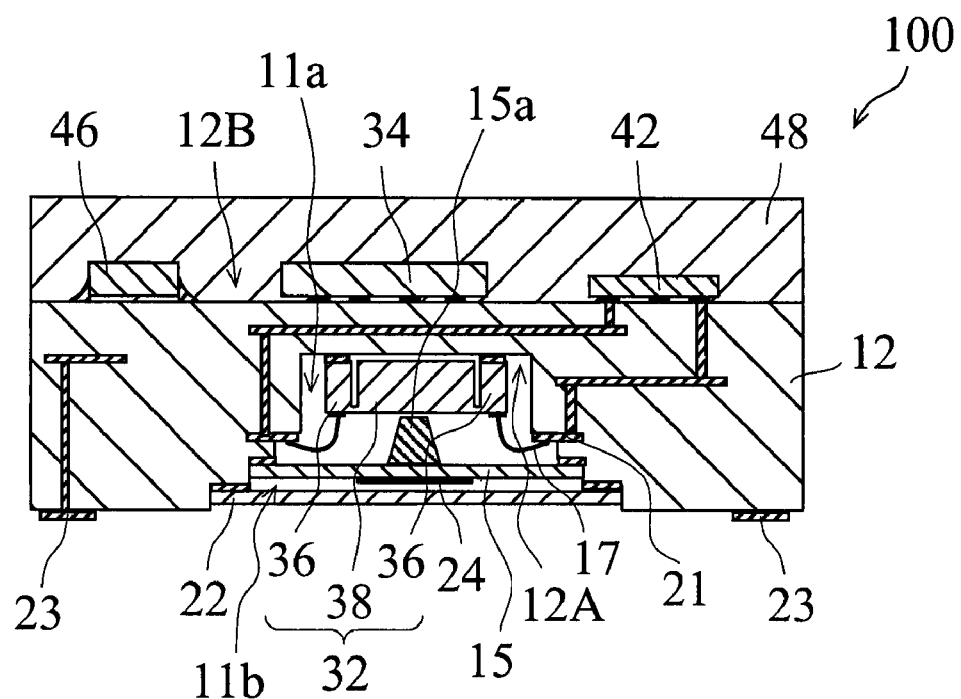
FIG. 10 is a schematic cross sectional view of the sensor module according to one embodiment.
Figure 11:
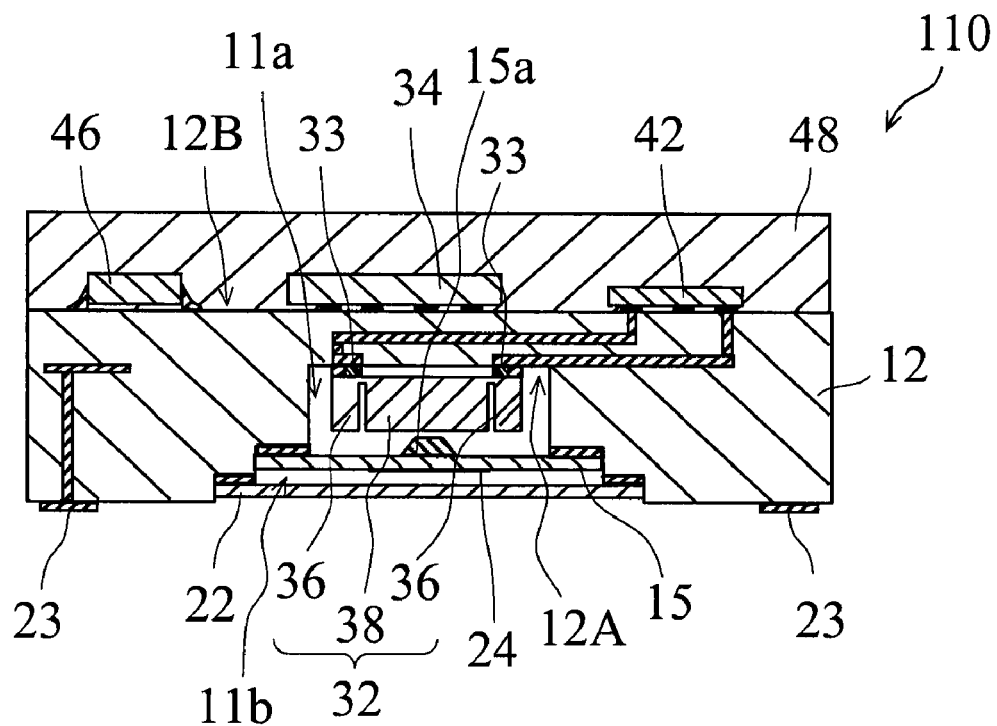
FIG. 11 is a schematic cross sectional view of the sensor module according to one embodiment.

FIG. 11 is a modified example of the sensor module in FIG. 10.

In sensor module 110, the acceleration sensor 32 is flip-chip mounted.

Figure 12:
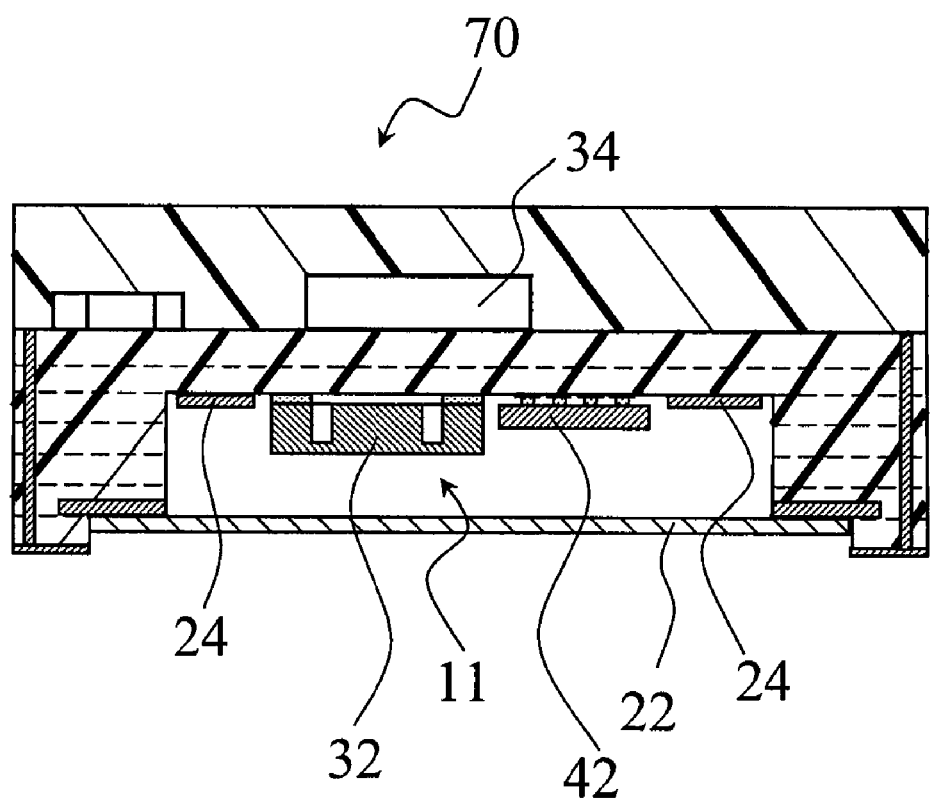
FIG. 12 is a schematic cross sectional view of the sensor module.

FIG. 12 is a modified example of the sensor module in FIG. 1. The second circuit element 42 exists in addition to the acceleration sensor 32 in the inner portion of the cavity 11. The second circuit element 42 is arranged and fixed, for example, in the mounting surface 12A of the base body 12 within the cavity 11, for example, in accordance with a flip-chip mounting.

Figure 13:
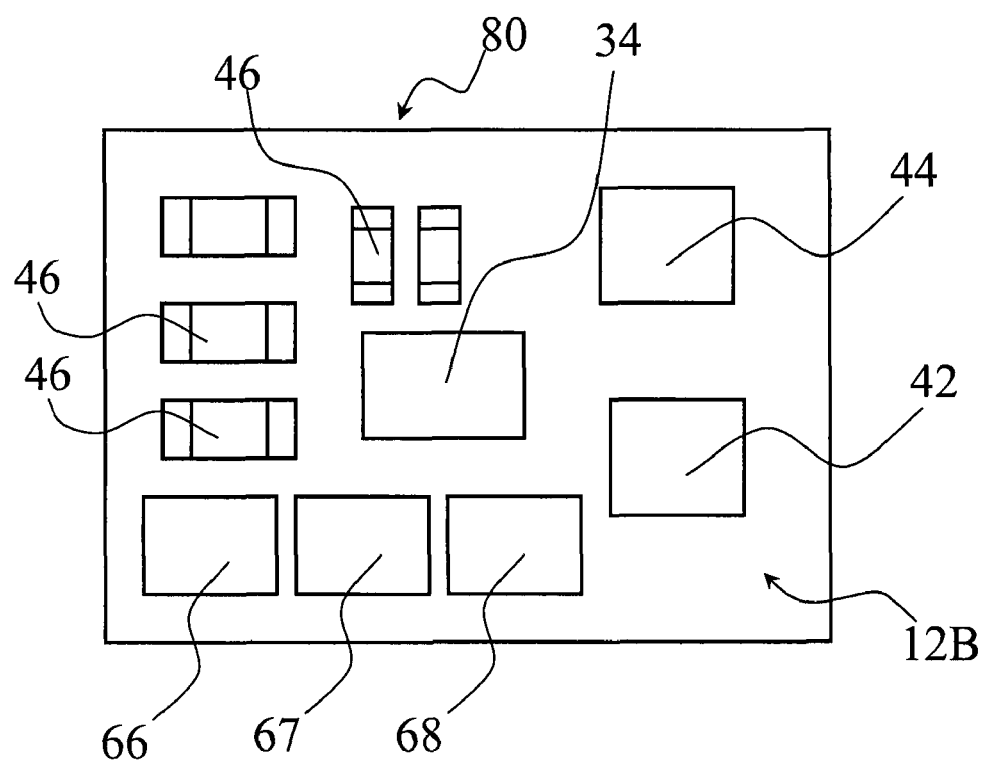
FIG. 13 is a schematic top plan view of a state in which the sealing resin layer of the sensor module is removed.

A description will be given of a modified example of FIG. 1 using FIG. 13. FIG. 13 shows a state in which the sealing resin layer 48 is removed from the sensor module 80. The sensor module 80 is provided with a radio device 66, a battery 67, a power generator 68 and the like in the board surface 12B in the opposite side mentioned above the base body 12. The radio device 66, the battery 67 and the power generator 68 are bonded and fixed to the board surface 12B in the opposite side of the base body 12, for example, in accordance with a flip-chip mounting. The radio device 66 and the power generator 68 are connected to the circuit elements 42 and 44, and the like via an electrode pad and a conducting pattern which are provided in the board surface 12B and are not illustrated. The radio device 66 is a known send/receive module having an information or energy transmitting function in accordance with a radio transmission. The radio communication module may employ a known radio communication module, for example, a send/receive module on the basis of Bluetooth (trade mark) standard, a send/receive module on the basis of WiFi standard, a send/receive module on the basis of ZigBee standard and the like. Further, the radio device 66 may be constituted by a receiving module capable of receiving a position information signal in a so-called GPS (global positioning system). In this case, an information processing circuit (not shown) provided in the board surface 12B may determine the current position information (longitude and latitude) of the sensor module 10 in correspondence to the position information signal received by the radio device 66.

The battery 67 is a known battery feeding electric power to each of the constructing members of the radio device 66 and the sensor module 10. The power generator 68 is constituted, for example, by an MEMS power generating element or the like converting energy of oscillation of the base body 12 into electric power energy, or a piezoelectric element or the like generating electricity in correspondence to a deformation or a strain caused by the energy given from the external portion. The power generator 68 feeds the electric power to the battery 67, and stably maintains the electric power of the remaining amount of the battery 67 at a fixed level. Further, the radio device 66 may be provided with an energy converting mechanism converting energy of an electromagnetic wave transmitted from the external portion into electric power. In this case, for example, the energy converting mechanism of the radio device 66 may convert the energy of the electromagnetic wave transmitted from the external portion into electric power, and charge the converted electric power in the battery 67. In this case, it is possible to effectively prevent the electric power from being reduced comparatively in the battery 67, and it is possible to make operational reliability of the sensor module 10 comparatively high. At this time, the energy converting mechanism may employ a structure using a well-known fall wave rectifying circuit, for example, constructed by combining a diode, a condenser, a resistor and the like, and an antenna (not shown). For example, the antenna (not shown) may receive the electromagnetic wave transmitted from the external portion, and the full wave rectifying circuit may rectify a high frequency current induced by the antenna by receiving the electromagnetic wave so as to convert it into a direct current, and store it in the battery 67. The kinds of radio device 66 and battery 67 are not particularly limited. Further, the kind of member arranged in the side of the board surface 12B is not limited to the radio device, the battery or the like. Further, the kind and the number of the members arranged in the base body are not particularly limited.

The embodiment may be varied within the range of the scope of the present invention. For example, the acceleration sensor 32 may be mounted to the base body 12 in accordance with a flip-chip mounting, or may be electrically connected thereto in accordance with a wire bonding.

The member arranged within the cavity 11 is not limited to the circuit element 42 and, for example, the various condensers and the like may be arranged within the cavity 11. The kind and the number of the members arranged within the cavity 11 are not particularly limited.

In the present invention, in any of the embodiments mentioned above, the radio device 66, the battery 67, the power generator 68 and the like may be provided in the board surface 12B in the opposite side of the base body 12.

Further, in each of the modes and the embodiments mentioned above, the diaphragm type pressure sensor constructed in the base body is shown as the electrostatic capacity type pressure sensor measuring the external pressure of the cavity 11 on the basis of the electrostatic capacity between the lid body having the flexibility and the fixed electrode. The kind of pressure sensor is not particularly limited.

Further, the kind of sensor accommodated within the cavity 11 is not particularly limited. In each of the modes and the embodiments mentioned above, the example in which the piezo resistor type acceleration sensor element is arranged within the cavity 11 is described, however, an acceleration sensor having a different structure from the piezo resistance type acceleration sensor may be arranged within the cavity 11, for example, a cantilever type acceleration sensor (a so-called shock sensor) using a bimorph piezoelectric element. Further, it is not necessary to be limited to the arrangement of the acceleration sensor within the cavity 11, but it is possible to arrange the sensor measuring other kinetic momentum, for example, an angular velocity sensor or the like, and a temperature sensor or the like. In the same manner, the sensor arranged in the opposite side surface to the cavity in the base body is not limited to the temperature sensor, but it is possible to arrange the piezo resistance type acceleration sensor, the cantilever type acceleration sensor or the angular velocity sensor. It is possible to integrate the various sensors measuring the desired physical quantities in a comparatively compact manner, as mentioned above.

Figure 14A:
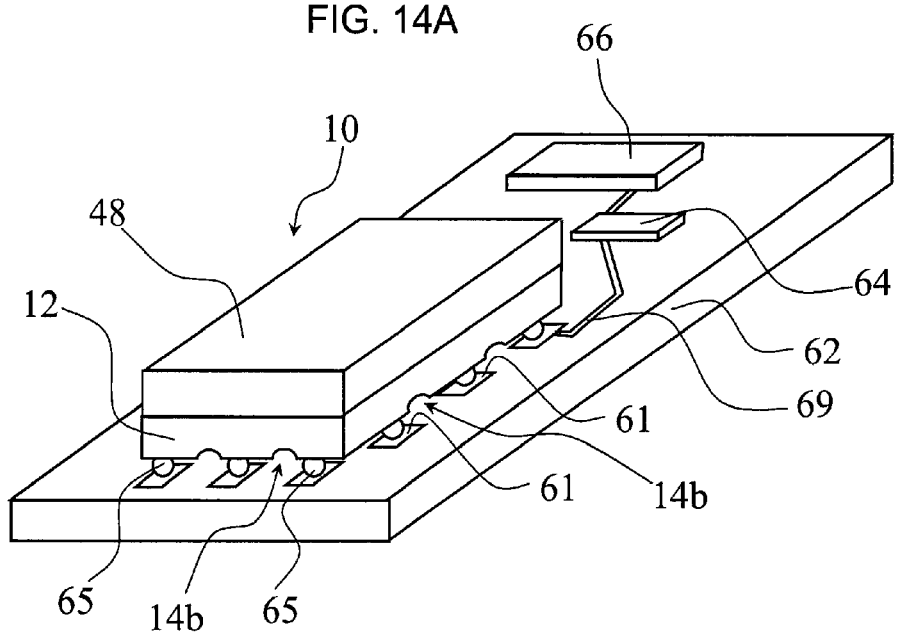
FIG. 14A is a schematic perspective view showing a sensor module mounted to a support board.
Figure 14B:
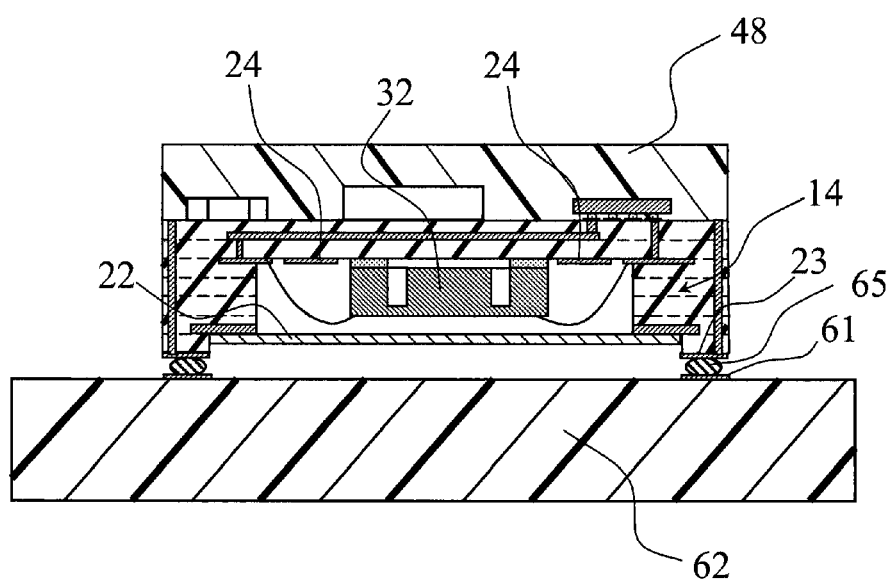
FIG. 14B is a schematic cross sectional view of the sensor module shown in FIG. 14A.

FIG. 14 illustrates the sensor module 10 which is mounted on the surface of the support board 62. FIG. 14A is a schematic perspective view showing a sensor module 10 mounted to a support board 62 and FIG. 14B is a schematic cross sectional view of the sensor module 10 shown in FIG. 14A. In the description of the drawings after FIG. 14, a description will be given of the case that the sensor module 10 in FIG. 1 is mounted, as a representative of the embodiments and the modified examples, however, it is possible to employ the sensor module in any of the embodiments mentioned above.

The mounting board 62 is an insulative board, for example, made of ceramics or the like, and a control element 64 and the radio device 66 are provided in the surface of the mounting board 62. An electrode pad 61 and a conductive pattern 69 (illustrated only partially) are provided in the surface of the mounting board 62. The control element 64 and the radio device 66 are arranged and fixed to the surface of the mounting board 62, for example, in accordance with a flip-chip mounting using a solder.

The lid body 22 of the sensor module 10 is away from the board surface of the mounting board 62 at a predetermined interval defined by a solder bump 65. The lid body 22 is surrounded by the frame portion 14 in its periphery, however, the protruding end surface of the frame portion 14 is away from the board surface of the mounting board 62 at the interval defined by the solder bump 65. In other words, the lid body 22 comes into contact with a peripheral air in which the mounting board 62 is installed, at least via the interval defined by the solder bump 65, and the lid body 22 deforms in correspondence to the pressure difference between the pressure of the peripheral air and the cavity 11. Further, a plurality of grooves 14b formed from a center portion of the lid body 22 toward an outer side of the base body 12 are provided in the protruding end of the frame portion 14 in the base body 12 of the sensor module 10, and the lid body 22 also comes into contact with the peripheral air in which the mounting board 62 is installed, via the grooves 14b.

The control element 64 is electrically connected to the external connecting terminal 23 of the sensor module 10, and the radio device 66 mounted to the mounting board 62, via the electrode pad 61 and the conductive pattern 69. The control element 64 receives various information, for example, the pressure information measured by the diaphragm type pressure sensor 13, the acceleration information measured by the acceleration sensor 32, the temperature information measured by the third sensor 34 and the like, which are output from the circuit elements 42 and 44. The radio device 66 transmits the received various information in accordance with a command of the control element 64 at a previously set determined timing. Further, it carries out control of a data processing motion in each of the circuit elements 42 and 44, on the basis of the external command information received by the radio device 66.

The radio device 66 is a known send/receive module having an information sending and receiving function in accordance with a radio communication. The radio communication module may employ the known radio communication module, for example, the send/receive module on the basis of Bluetooth (trademark) standard, the send/receive module on the basis of WiFi (trademark) standard, the send/receive module on the basis of ZigBee (trademark) standard and the like. Further, the radio device 66 may be constituted by the receiving module capable of receiving the position information signal in the so-called GPS (global positioning system). In this case, for example, the control element 64 may determine the current position information (longitude and latitude) of the sensor module 10 in correspondence to the position information signal received by the radio device 66. A battery (not shown) is arranged in the surface of the mounting board 62, and the radio device 66 and the sensor module 10 may receive necessary electric power from the battery. In the case mentioned above that the radio device 66 is mounted to the board surface 12B (in the case that the sensor module 80 shown in FIG. 13 is used), it is preferable, for example, that only the control element 64 is arranged in the surface of the mounting board 62.

Figure 15:
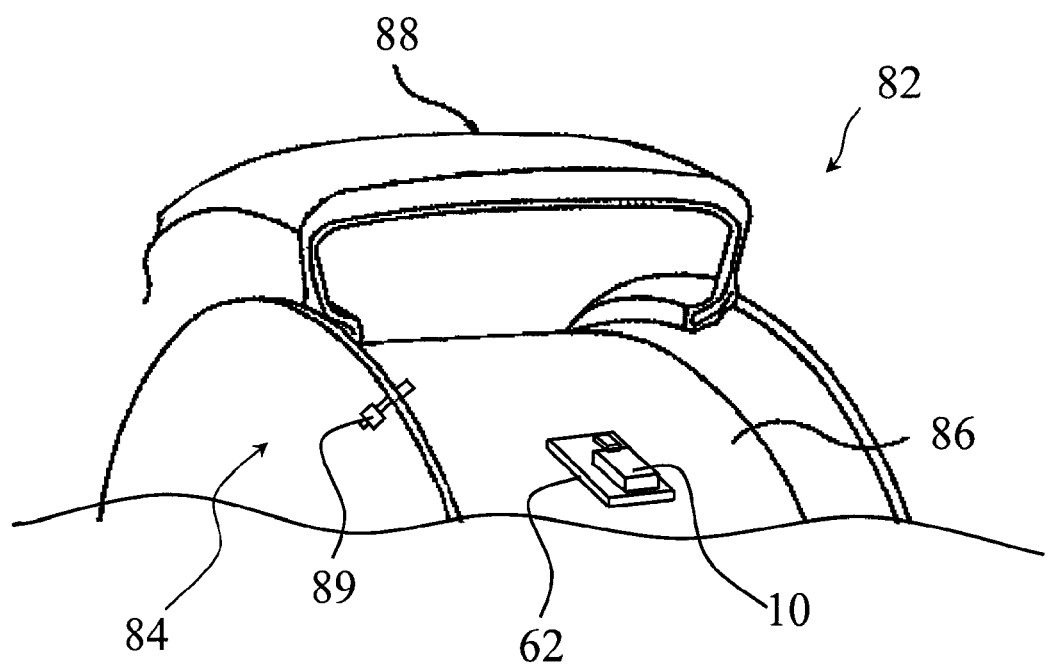
FIG. 15 is a schematic cross sectional perspective view showing a state in which a sensor module in accordance with an embodiment is fixed to a wheel constructing a tire/wheel assembly installed to a vehicle.

A description will be given of an example which measures a plurality of physical quantities of the physical object to be measured, by using the sensor module mentioned above, using FIG. 15. FIG. 15 shows a state in which the sensor module 10 is fixed to a wheel 84 constructing a tire/wheel assembly 82 installed to the vehicle.

The tire/wheel assembly 82 is structured such that a tire 88 is assembled in the wheel 84. The sensor module 10 is fixed to the tire/wheel assembly 82 by the mounting board 62 mentioned above being fixed to an outer peripheral surface of a rim 86 constructing the wheel 84. The mounting board 62 is firmly attached to the outer peripheral surface of the rim 86, for example, by an adhesive agent. Although not being illustrated in FIG. 15, the mounting board 62 may be provided with a sealing layer covering the sensor module 10, the control element 64, the radio device 66 and the like, and a casing covering the sensor module 10, the control element 64, the radio device 66 and the like. It is preferable that the sealing layer and the casing mentioned above are constructed by a material which does not obstruct the radio communication function in the radio device 66, for example, a resin or the like.

Figure 16:
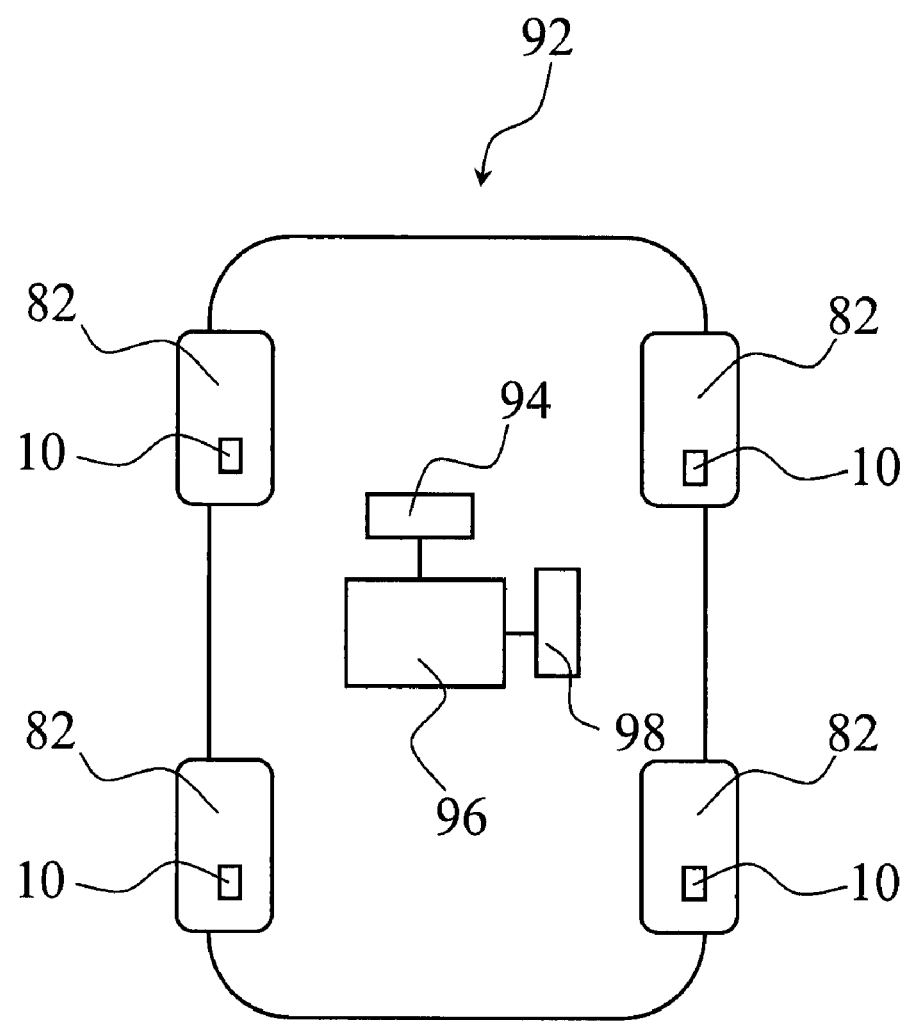
FIG. 16 is a schematic block diagram illustrating the vehicle to which the tire/wheel assembly shown in FIG. 14 is installed.

The tire/wheel assembly 82 is installed to each of a plurality of wheel positions of a vehicle 92, as shown in FIG. 16. The vehicle 92 is provided with a receiver 94 connected to an antenna (not shown), a processing device 96 processing the information received by the receiver 94, and an informing means 98 operating in response to the result of processing in the processing device 96. The informing means 98 is constituted, for example, by a display, a buzzer or the like, and is structured such as to display an alarm screen or issue an alarm sound with respect to a driver driving the vehicle 92.

As mentioned above, the lid body 22 of the sensor module 10 comes into contact with the air sealed between the wheel 84 and the tire 88 via the interval defined by the solder bump 65, and the lid body 22 deforms in correspondence to a pneumatic pressure in an inner portion of the tire 88. In this state, the diaphragm type pressure sensor of the sensor module 10 functions as a tire internal pressure sensor measuring the pneumatic pressure in the inner portion of the tire 88. In the sensor module 10, the board surface of the mounting board 62 is arranged in such a manner as to cover the lid body 22, in the state of being mounted to the mounting board 62. Further, a side directed to a cavity region of the tire 88 of the lid body 22 is covered by the base body 12. There is the case in that comparatively hard refuse such as a pebble or the like enters the inner portion of the tire 88. In this case, the comparatively hard refuse flies in all directions at a comparatively high speed, in the inner portion of the tire 88, during the travel of the vehicle, that is, during the rolling of the tire 88. If the comparatively hard refuse comes into collision with the lid body 22 having flexibility at a comparatively high speed, the characteristic of the lid body 22 is changed, and the lid body 22 may be broken in some cases. In the sensor module 10, the lid body 22 is arranged so as to be directed to the opposite side of the side facing the inner portion of the tire 88. In addition, in the sensor module 10, the mounting board 62 and the base body 12 are arranged in such a manner as to cover the lid body 22, and it is possible to reduce the possibility that the refuse comes into collision with the lid body 22, even during the rolling of the tire/wheel assembly 82.

During the traveling of the vehicle, the tire/wheel assembly 82 and the wheel 84 roll, however, the sensor module 10 rotationally moves in correspondence to the rolling of the wheel 84, and oscillates in accordance with the oscillation of the wheel 84. The acceleration sensor 32 of the sensor module 10 can measure the magnitude of the acceleration generated in accordance with the rotation of the wheel 84 generated together with the traveling of the vehicle, at a comparatively high precision. The acceleration sensor 32 can measure accelerations in three orthogonal axes, for example, respective accelerations in a radial direction, a width direction and a peripheral direction of the tire 88. The information measured by the sensor module 10 is transmitted in accordance with the radio communication from the radio device 66, as mentioned above.

The various information transmitted from the radio device 66 is received by the receiver 92 provided in the vehicle 92, and is transmitted to the processing device 96. For example, in the case that the processing device 96 receives the information of the current pneumatic pressure within the tire 88, and the current pneumatic pressure of the tire 88 is below a predetermined threshold value, the processing device 96 controls the motion of the informing means 98 so as to issue an alarm to the driver. Further, it calculates the current tire rotating speed, tire slip degree against a traveling road surface and the like, for example, on the basis of acceleration information having a comparatively low frequency, generated by the acceleration sensor 32. In the vehicle 92, motion of the vehicle 92 is controlled by a motion control system (not shown) on the basis of the information of the rotating speed and the slip degree. The vehicle 92 is provided with a motion control system, for example, a known anti lock brake system (ABS), a traction control system (TCS), a side slip preventing system (EPS) and the like, and can actuate each of the systems at a comparatively high controllability on the basis of the information of the rotating speed and the slip degree. Further, it is also possible to measure the magnitude of an oscillation generated in the tire/wheel assembly 82 or the tire 88, on the basis of the acceleration information of the oscillation having a comparatively high frequency, for example, generated by the acceleration sensor 32. The magnitude of the oscillation generated in the tire/wheel assembly 82 or the tire 88 corresponds to the magnitude of impact applied to the tire/wheel assembly 82. For example, it is possible to evaluate the start timing of the traveling of the vehicle 92, road surface state in which the vehicle 92 travels (the tire 88 grounds), degree of a side slip of the tire 88 and the like, on the basis of acceleration information having a comparatively high frequency generated by the acceleration sensor 32. The information can be used for operating the vehicle motion control system provided in the vehicle 92, controlling the transmission timing of the information by the radio device 66, and the like.

By using the tire/wheel assembly mentioned above, it is possible to ascertain various information such as the pneumatic pressure within the tire during the vehicle traveling, the rotation of the wheel, the oscillation generated in the wheel, and the like, in real time even during the traveling of the vehicle. Further, in the vehicle side, it is possible to control the vehicle motion at a higher precision on the basis of the acquired various information.

Figure 17:
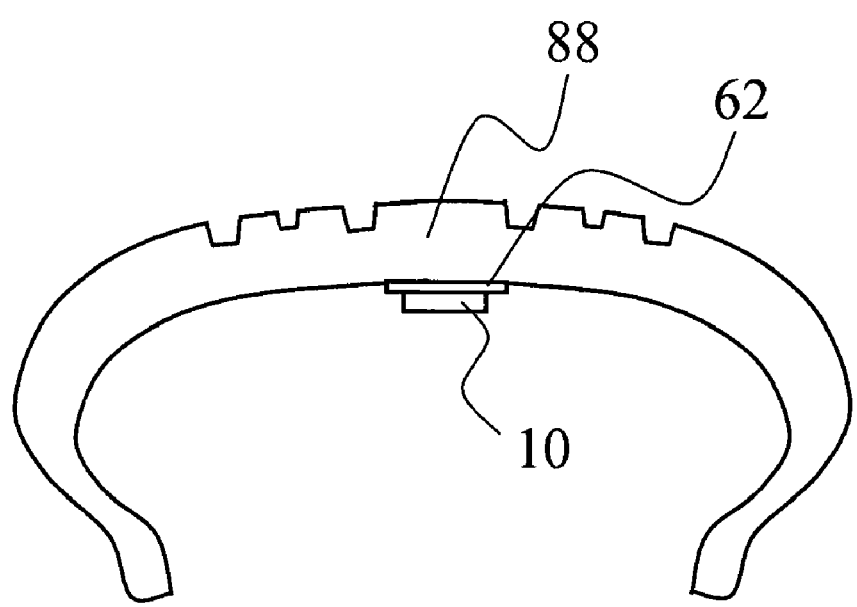
FIG. 17 is a schematic cross sectional view illustrating a state in which the sensor module is fixed to an inner peripheral surface of the tire.

In the example mentioned above, the description is given of the example in which the sensor module 10 is attached to the outer peripheral surface of the wheel 86 constructing the tire/wheel assembly 82, however, it may be attached, for example, to an end portion of an inner peripheral surface side of the tire 88, in the pneumatic valve 89 provided in the wheel 86. Further, for example, the sensor module 10 may be attached to the inner peripheral surface of the tire 88, as shown in FIG. 17. Further, the sensor module 10 may be embedded and arranged in the inner portion of the tread portion or the side portion of the tire 88, in a state in which the pneumatic pressure in the inner portion of the tire 88 is applied to the lid body of the sensor module 10. In the case mentioned above, it is possible to more directly measure the information, for example, the deformation and the oscillation of the tread portion of the tire 88. In this case, in the vehicle 92, the motion control system such as the ABS, the TCS, the EPS and the like may be actuated on the basis of the information, for example, the deformation and the oscillation of the tread portion, of the tire 88.

In the examples mentioned above, the description is given of the case that the sensor module is installed to the tire/wheel assembly installed to the vehicle, however, it may be installed, for example, to a tire/wheel assembly constructing a wheel of an aircraft, and it is not particularly limited to being installed to the tire/wheel assembly so as to be used.

The description is given above of the sensor module, the wheel with sensor, and the tire/wheel assembly, however, the present invention is not limited to the modes, the embodiments and the examples mentioned above, and it goes without saying that the present invention can be variously modified and changed within the range of the scope of the present invention. For example, the sensor module in accordance with the present invention may be used for measuring ambient pressure.

For example, in each of the embodiments of the sensor module in accordance with the present invention, the plan shape at the time of viewing the lid body 22 from the main surface direction may be set to a circular shape. In the case that the shape of the main surface of the lid body 22 is the circular shape, stress applied to a circumferential portion of the lid body 22 becomes uniform at a time when the pressure is applied to the lid body 22. Accordingly, it is possible to reduce breakage of an outer peripheral portion of the lid body 22. Further, plan shape at a time of viewing the fixed member 15 in FIGS. 10 and 11 may be set to a circular shape in the same manner.

What is claimed is:

1. A sensor module comprising:
   a substrate having a cavity in a surface thereof;
   a first sensor inside the cavity;
   a second sensor inside the cavity; and
   a lid body sealing the cavity and including an internal surface,
   wherein the second sensor comprises:
      a first electrode located on an internal surface of the lid body; and
      a second electrode located in the cavity.

2. The sensor module according to claim 1, wherein the second electrode is disposed on the surface of the substrate.

3. The sensor module according to claim 1, wherein the distance between the second electrode and the lid body is equal to or less than a distance between the first sensor and the lid body.

4. The sensor module according to claim 3, further comprising a step positioned between the second sensor and the lid body in the cavity, wherein the second electrode is disposed on the surface of the step.

5. The sensor module according to claim 3, wherein the second electrode is located on the surface of the second sensor.

6. The sensor module according to claim 1, wherein the first sensor includes an acceleration sensor and the second sensor includes a pressure sensor.

7. The sensor module according to claim 1, further comprising an electronic circuit part connected to at least one of the first sensor and the second sensor, at least one of disposed in the cavity and disposed on the opposite surface to a side in which the cavity is arranged, of the substrate.

8. The sensor module according to claim 7, wherein the electronic circuit part includes at least one of a pressure circuit element outputting a pressure value outside the cavity, and a transmitter transmitting at least one of information and energy, on the basis of an electric capacity in a gap between the lid body and the fixed electrode.

9. The sensor module according to claim 1, further comprising a third sensor.

10. The sensor module according to claim 9, wherein the third sensor includes a temperature sensor.

11. The sensor module according to claim 1, further comprising a fixed member arranged so as to be opposite of the lid body, between the lid body and the first sensor, wherein the second electrode is arranged in a surface of the fixed member, in a state opposite of the first electrode.

12. The sensor module according to claim 11, wherein the first sensor has a fixed portion fixed within an accommodating space and a movable portion supported to the fixed portion, and the fixed member is opposite of the movable portion at a critical position of a movable range.

13. The sensor module according to claim 11, wherein the sensor includes a fixed portion fixed within the accommodating space and a movable portion supported to the fixed portion and having a sensor pattern in the lid body side, the fixed member is opposite of the movable portion at a critical position of a movable range, and the fixed member has the fixed electrode as a region having a conductivity in a side opposite of the lid body of an insulative base material.

14. The sensor module according to claim 11, further including an accommodating space separated into a first space in a side in which the sensor is arranged, and a second space in a side in which the lid body is arranged by the fixed member.

15. The sensor module according to claim 14, wherein air pressure within the second space is lower than air pressure within the first space.

16. The sensor module according to claim 11, wherein a projection portion is provided in the surface of the fixed member, and the projection portion is opposite of the second sensor.

17. A wheel with sensor comprising:
   a wheel;
   a support board fixed to the wheel; and
   the sensor module according to claim 1 mounted on the support board.

18. A tire/wheel assembly comprising:
   the wheel with sensor according to claim 16; and
   a tire assembled in the wheel with sensor,
   wherein the support board is provided within a space formed by the wheel and the tire.

19. The tire/wheel assembly according to claim 18, further comprising an air valve provided in the wheel, wherein the sensor module is provided around the air valve.

20. A rotating body used by being rotated, comprising:
   a rotary body; and
   the sensor module according to claim 1 provided in a part of the rotary body.

* * * * *